(12) United States Patent
Classen

(10) Patent No.: US 11,111,137 B2
(45) Date of Patent: Sep. 7, 2021

(54) METHOD FOR MANUFACTURING A MICROMECHANICAL SENSOR

(71) Applicant: Robert Bosch GmbH, Stuttgart (DE)

(72) Inventor: Johannes Classen, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/323,133

(22) PCT Filed: Jul. 5, 2017

(86) PCT No.: PCT/EP2017/066724
§ 371 (c)(1),
(2) Date: Feb. 4, 2019

(87) PCT Pub. No.: WO2018/041444
PCT Pub. Date: May 8, 2018

(65) Prior Publication Data
US 2019/0161347 A1    May 30, 2019

(30) Foreign Application Priority Data

Aug. 29, 2016 (DE) .......................... 102016216207.1

(51) Int. Cl.
*B81C 1/00* (2006.01)
*H04R 19/00* (2006.01)
(Continued)

(52) U.S. Cl.
CPC ........ *B81C 1/00309* (2013.01); *B81B 3/0005* (2013.01); *B81B 7/007* (2013.01);
(Continued)

(58) Field of Classification Search
CPC ............ B81C 1/00309; B81C 1/00269; B81C 1/00563; B81C 1/00158;
(Continued)

(56) References Cited

U.S. PATENT DOCUMENTS 6,297,981 B1   10/2001  Berberich et al.
6,373,705 B1    4/2002  Koelle et al.
(Continued)

FOREIGN PATENT DOCUMENTS

DE   102006011545 A1   9/2007
DE   102006024671 A1   11/2007
(Continued)

OTHER PUBLICATIONS

International Search Report for PCT/EP2017/066724, dated Oct. 5, 2017.

*Primary Examiner* — Sarah K Salerno
(74) *Attorney, Agent, or Firm* — Norton Rose Fulbright US LLP; Gerard Messina

(57) ABSTRACT

A method for manufacturing a micromechanical sensor, including the steps: providing a MEMS wafer that includes a MEMS substrate, a defined number of etching trenches being formed in the MEMS substrate in a diaphragm area, the diaphragm area being formed in a first silicon layer that is situated at a defined distance from the MEMS substrate; providing a cap wafer; bonding the MEMS wafer to the cap wafer; and forming a media access point to the diaphragm area by grinding the MEMS substrate.

20 Claims, 17 Drawing Sheets

(51) Int. Cl.
*H04R 31/00* (2006.01)
*B81B 3/00* (2006.01)
*B81B 7/00* (2006.01)

(52) U.S. Cl.
CPC .......... *B81B 7/0051* (2013.01); *B81B 7/0061* (2013.01); *B81C 1/00301* (2013.01); *B81C 1/00325* (2013.01); *B81C 1/00968* (2013.01); *H04R 19/005* (2013.01); *H04R 31/006* (2013.01); *B81B 2201/0235* (2013.01); *B81B 2201/0242* (2013.01); *B81B 2201/0257* (2013.01); *B81B 2201/0264* (2013.01); *B81B 2203/0127* (2013.01); *B81B 2207/012* (2013.01); *B81C 2201/0125* (2013.01); *B81C 2201/0132* (2013.01); *B81C 2201/0178* (2013.01); *B81C 2201/112* (2013.01); *B81C 2203/0118* (2013.01); *B81C 2203/0792* (2013.01)

(58) Field of Classification Search
CPC ....... B81C 2201/0126; B81C 203/0118; B81B 2201/0235; B81B 2203/0127
See application file for complete search history.

(56) References Cited

U.S. PATENT DOCUMENTS

| | | | |
|---|---|---|---|
| 7,250,353 B2 | 7/2007 | Nasiri et al. | |
| 7,442,570 B2 | 10/2008 | Nasiri et al. | |
| 8,076,696 B2 | 12/2011 | Beaupre et al. | |
| 9,130,531 B1* | 9/2015 | Cheng | B81B 7/0083 |
| 9,379,083 B2 | 6/2016 | Iizuka et al. | |
| 9,379,634 B2 | 6/2016 | Okumura et al. | |
| 2001/0034144 A1 | 10/2001 | Chemin | |
| 2002/0106828 A1 | 8/2002 | Loeppert | |
| 2008/0123876 A1* | 5/2008 | Sato | H04R 19/016 381/174 |
| 2010/0109102 A1 | 5/2010 | Chen et al. | |
| 2010/0164025 A1* | 7/2010 | Yang | H04R 19/005 257/416 |
| 2011/0012247 A1 | 1/2011 | Wu | |
| 2011/0049652 A1 | 3/2011 | Wu et al. | |
| 2011/0307102 A1 | 12/2011 | Czamara et al. | |
| 2012/0049299 A1 | 3/2012 | Chou | |
| 2012/0235251 A1 | 9/2012 | Daneman et al. | |
| 2012/0241953 A1 | 9/2012 | Yamada et al. | |
| 2013/0286602 A1 | 10/2013 | Chang | |
| 2013/0334626 A1* | 12/2013 | Weber | B81B 3/0018 257/416 |
| 2013/0334627 A1* | 12/2013 | Conti | B81B 3/0021 257/416 |
| 2014/0002995 A1 | 1/2014 | Pal | |
| 2014/0072152 A1 | 3/2014 | Yang et al. | |
| 2014/0225482 A1 | 8/2014 | Hara et al. | |
| 2014/0264651 A1 | 9/2014 | Dehe et al. | |
| 2015/0001651 A1* | 1/2015 | Faralli | B81C 3/00 257/417 |
| 2015/0001653 A1* | 1/2015 | Schelling | B81B 3/0021 257/419 |
| 2015/0077942 A1 | 3/2015 | Roche | |
| 2015/0232327 A1* | 8/2015 | Reinmuth | B81C 1/00666 257/417 |
| 2016/0027716 A1 | 1/2016 | Yamada | |
| 2016/0327446 A1* | 11/2016 | Classen | G01L 19/0636 |

FOREIGN PATENT DOCUMENTS

| | | |
|---|---|---|
| DE | 10 2007 048604 A1 | 4/2009 |
| DE | 102009045385 A1 | 4/2011 |
| DE | 102013213071 B3 | 10/2014 |
| DE | 10 2013 213 065 A1 | 1/2015 |
| DE | 102014200512 A1 | 7/2015 |
| EP | 0907310 A2 | 4/1999 |
| JP | 2006287005 A | 10/2006 |

\* cited by examiner

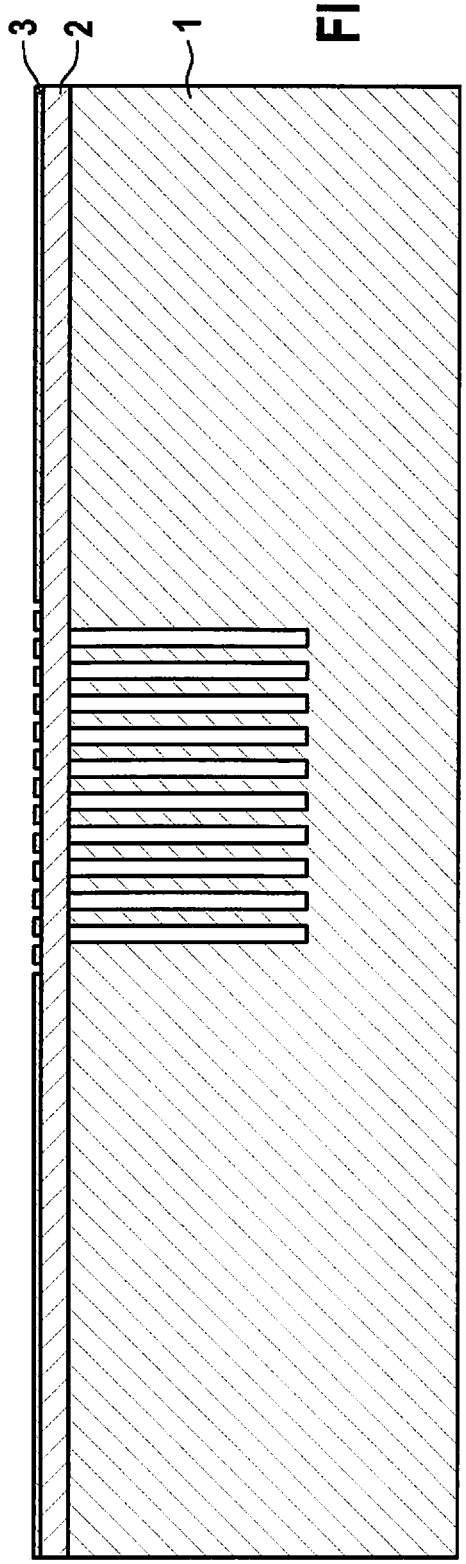
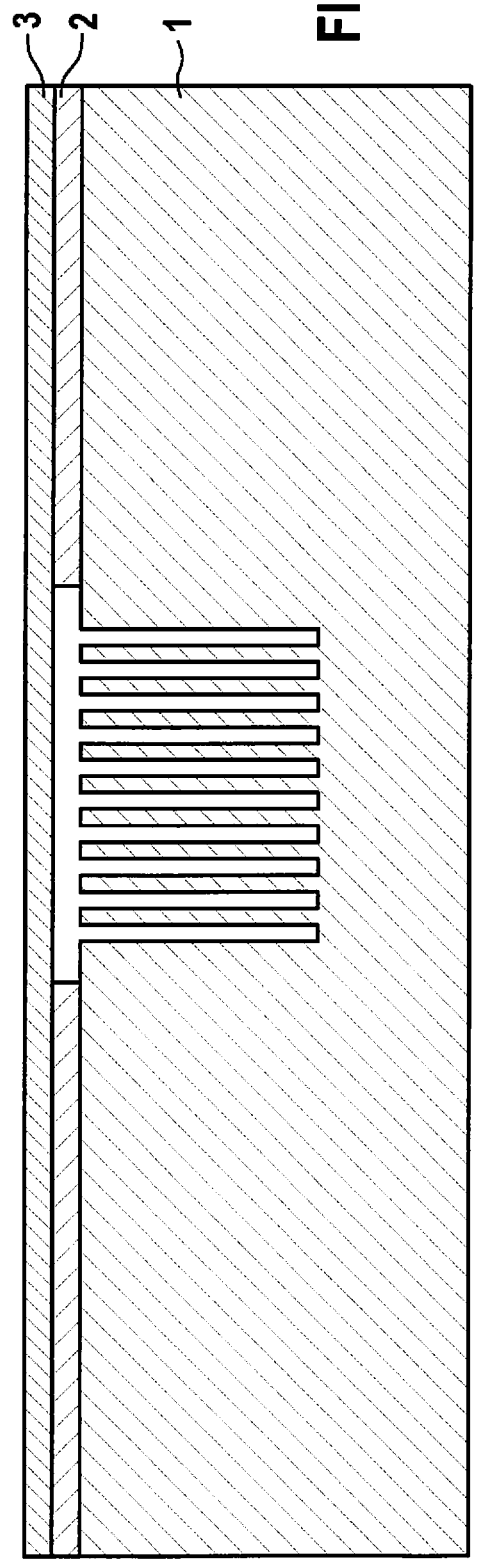

METHOD FOR MANUFACTURING A MICROMECHANICAL SENSOR

FIELD

The present invention relates to a method for manufacturing a micromechanical sensor.

BACKGROUND INFORMATION

Micromechanical inertial sensors for measuring acceleration and rotation rate are mass-produced for various applications in the automotive and consumer sectors. In particular in the field of inertial sensor systems, methods of so-called vertical integration, hybrid integration, or 3D integration are being increasingly used. In these manufacturing methods, at least one MEMS wafer and one evaluation ASIC wafer are mechanically and electrically joined together via wafer bonding processes, as is described in U.S. Pat. Nos. 7,250,353 B2, 7,442,570 B2, U.S. Patent Application Pub. Nos. 2010 0109102 A1, 2011 0049652 A1, 2011 0012247 A1, 2012 0049299 A1, and German Patent Application No. DE 10 2007 048604 A1, for example.

These vertical integration methods in combination with electrical vias in the form of through silicon vias (TSVs) and flip chip technologies, with which the external electrical contacting may be implemented as a "bare die" module or chip scale package, i.e., without plastic outer packaging, as described in U.S. Patent Application Pub. No. 2012 0235251 A1, for example, are particularly favored.

Enhancements in inertial sensor technology have been provided in the course of increasing functional integration, i.e., the integration of multiple sensing variables in a single sensor module. The stated functional integration advantageously promises a reduction in costs as well as reduced space requirements on the application circuit board. Various enhancements for integrating a pressure sensor into the inertial sensor process are described in German Patent Application Nos. DE 10 2206 011 545 A1, DE 10 2006 024 671 A1, DE 10 2013 213 065 A1, and DE 10 2013 213 071 B3, for example.

One of the major challenges for the pressure sensor system is the production of a media access point. This results in significant technical difficulties.

Most of the above-cited patents and patent applications include a so-called backside port for the media access point, as described in German Patent Application No. DE 10 2014 200 512 A1, for example. At the end of the overall process, one or multiple access holes are provided from the rear side of the MEMS substrate wafer, beneath the diaphragm area, via an etching process, preferably a trenching process (deep reactive ion etching (DRIE)). The stated etching process stops on the oxide, which is situated directly on the substrate wafer and beneath the pressure sensor diaphragm. Since oxide is not a well-suited material for the sensor diaphragm (for example, due to moisture absorption, mismatch of the thermal expansion coefficients for silicon, internal stress, etc.), the oxide layer on the bottom side of the diaphragm must be removed if possible. This preferably takes place by etching with HF in the gas phase (so-called gas phase etching).

One problem is that not only the rear side of the wafer, but at the same time also the outer side of the counterbonded wafer and the wafer edge, are etched. If the counterbonded wafer is an ASIC with rewiring levels and passivation levels, the gas phase etching would result in damage to the rear side of the ASIC. Protecting the rear side of the ASIC from the gas phase etching is not achievable using simple means.

German Patent Application No. DE 10 2013 213 071 B3 describes, as an alternative to the backside port, a process for producing a media access point via a so-called side port. In this case, the media access point is not provided directly vertically above or below the diaphragm area, but, rather, the medium is guided from the side via the side port into the area beneath the sensor diaphragm.

It is described in German Patent Application No. DE 10 2009 045 385 A1 that it is possible, via a fine oxide grid above a silicon layer, to apply deep trenches in the silicon, and subsequently to reclose the oxide grid, virtually topography-free, via further oxide depositions, so that process steps that are common for semiconductors or that use microsystem technology, such as layer depositions and lithographic processes, may be subsequently used without problems.

SUMMARY

An object of the present invention, therefore, is to reduce the above-mentioned disadvantages in the manufacture of a micromechanical sensor.

According to a first aspect of the present invention, the object may be achieved, for example, with a method for manufacturing a micromechanical sensor, including the steps:
  providing a MEMS wafer that includes a MEMS substrate, a defined number of etching trenches being formed in the MEMS substrate in a diaphragm area, the diaphragm area being formed in a first silicon layer situated at a defined distance from the MEMS substrate;
  providing a cap wafer;
  bonding the MEMS wafer to the cap wafer; and
  forming a media access point to the diaphragm area by grinding the MEMS substrate.

In this way a method for manufacturing a micromechanical sensor is implemented in which a sensitive diaphragm area is protected for a preferably long time from environmental effects or influences from process steps (for example, in the form of liquids, particles, etc.). This is advantageously achieved in that the exposure of the media access point is not carried out until the end of the manufacturing process, by grinding the MEMS substrate.

Preferred specific embodiments of the method for manufacturing a micromechanical sensor are described herein.

One advantageous refinement of the method provides that the following steps are carried out in forming the diaphragm area:
  a) applying an oxide layer to the MEMS substrate;
  b) forming through openings in the oxide layer;
  c) forming etching trenches in the diaphragm area of the MEMS substrate through the through openings of the oxide layer;
  d) closing the through openings of the oxide layer with oxide material;
  e) applying a first silicon layer to the oxide layer;
  f) forming through openings in the diaphragm area of the first silicon layer;
  g) removing the oxide layer beneath the through openings in the diaphragm area of the first silicon layer; and
  h) closing the through openings of the diaphragm area of the first silicon layer, essentially free of topography.

In this way, conventional methods of surface micromechanics may be used to form the diaphragm area.

Another advantageous refinement of the method according to the present invention provides that after step d), the following steps are carried out in forming the diaphragm area:

e1) removing the oxide material of the oxide layer in the area of the diaphragm area;
f1) bonding a silicon function wafer to the MEMS wafer; and
g1) back-grinding the silicon function wafer to a defined target thickness of the diaphragm area.

A first alternative process flow for producing the diaphragm area is advantageously provided in this way. It is advantageous that in this case the silicon layer does not have to be structured and backfilled. Electrical short circuits may thus be advantageously avoided for the most part.

Another advantageous refinement of the method provides that after step d), the following steps are carried out in forming the diaphragm area:

e2) providing a prestructured multilayer wafer, preferably an SOI wafer;
f2) joining the prestructured multilayer wafer to the MEMS wafer with the aid of a wafer bonding process;
g2) back-grinding the prestructured multilayer wafer to the target thickness of the second silicon layer;
h2) forming a bond interface on the second silicon layer;
i2) forming through openings in the second silicon layer for defining electrical contacts with the diaphragm area;
j2) opening the oxide layer beneath the through openings of the second silicon layer formed in step i2);
k2) depositing a metal in the through openings formed in steps i2) and j2), and structuring the metal to establish an electrical connection between the diaphragm area and the second silicon layer;
l2) carrying out a second trenching operation for forming MEMS structural elements in the second silicon layer; and
m2) removing oxide material beneath the MEMS structural elements formed in step l2).

Another advantageous alternative for forming the diaphragm area is provided in this way.

Another advantageous refinement of the method provides that during formation of the etching trenches in the MEMS substrate, additional etching trenches are formed that are laterally spaced apart in a defined manner, and that have a narrower design, in a defined manner, than etching trenches for the media access point. In this way, stress decoupling may be achieved with the aid of stress relief webs, without additional outlay for the diaphragm area.

Another advantageous refinement of the method provides that the diaphragm area is designed as a pressure sensor diaphragm. A useful application for the diaphragm area is achieved in this way.

Another advantageous refinement of the example method according to the present invention provides that the micromechanical sensor is designed as a micromechanical pressure sensor. A micromechanical pressure sensor may be provided in this way.

Another advantageous refinement of the method according to the present invention provides that the micromechanical pressure sensor is designed as a sound pressure sensor for a microphone. A useful application for the micromechanical pressure sensor is achieved in this way.

The present invention is described in greater detail below with further features and advantages, with reference to several figures. Identical or functionally equivalent elements have the same reference numerals. The figures are in particular intended to explain main principles that are used in connection with the present invention, and are not necessarily illustrated true to scale. For better clarity, it may be provided that not all reference numerals are provided in all figures.

It is expressly pointed out that the present invention also includes a micromechanical sensor element that may be manufactured by a manufacturing method described herein, or by a combination of same.

BRIEF DESCRIPTION OF THE DRAWINGS

FIGS. 1 through 7 show a process flow for producing a media access point of a micromechanical pressure sensor.

DETAILED DESCRIPTION OF EXAMPLE EMBODIMENTS

The present invention may provide a comparatively simple and cost-effective method for producing a backside port for a micromechanical sensor, in particular a micromechanical pressure sensor, preferably in a chip scale package, particularly preferably as a component that is vertically integrated with an ASIC. The provided method advantageously does not require gas phase etching after the wafer bonding. In addition, the application of a technically demanding side port may be avoided.

Further advantages of the provided method are, for example:

An application of technically complicated side ports may be dispensed with.

In addition, the sensitive diaphragm area, which may be vulnerable to particles or media entrainment during cleaning steps, is hermetically protected from external interfering influences up to the end of the process flow.

Furthermore, the provided method is compatible with various methods for manufacturing the pressure sensor diaphragm. These alternatively include, besides purely surface micromechanical methods, the provision of the functional layers by wafer bonding and back-grinding.

The deep trenches or etching trenches applied at the beginning of the provided process may advantageously also be used for applying stress decoupling trenches. For this purpose, either a two-stage trenching process is carried out, or a one-stage trenching process is carried out in which use is made of aspect ratio-dependent etching (ARDE) effects. With the aid of the stress decoupling trenches, a transfer of mechanical stress of the circuit board to the mechanism may advantageously be prevented, so that an improved or less distorted sensor signal may be achieved as a result.

The process flow is suitable for integrating a capacitive pressure sensor together with an inertial sensor (acceleration sensor and rotation rate sensor), for example to implement a 4D or a 7D sensor element.

The deep trenches may additionally be applied in separate sensor cavity areas for the inertial sensors, either as stress decoupling trenches or as vent channels for the inertial sensors. The vent channels may be utilized, after the wafer bonding, to evacuate the sensor cavities or fill them with defined quantities and types of gas, and/or to allow entry with anti-stiction coating. Vent channels for the inertial sensors may be subsequently closed via a laser reseal process, for example.

A process flow for manufacturing a micromechanical sensor is explained in greater detail below with reference to FIGS. 1 through 5.

Figure 1:
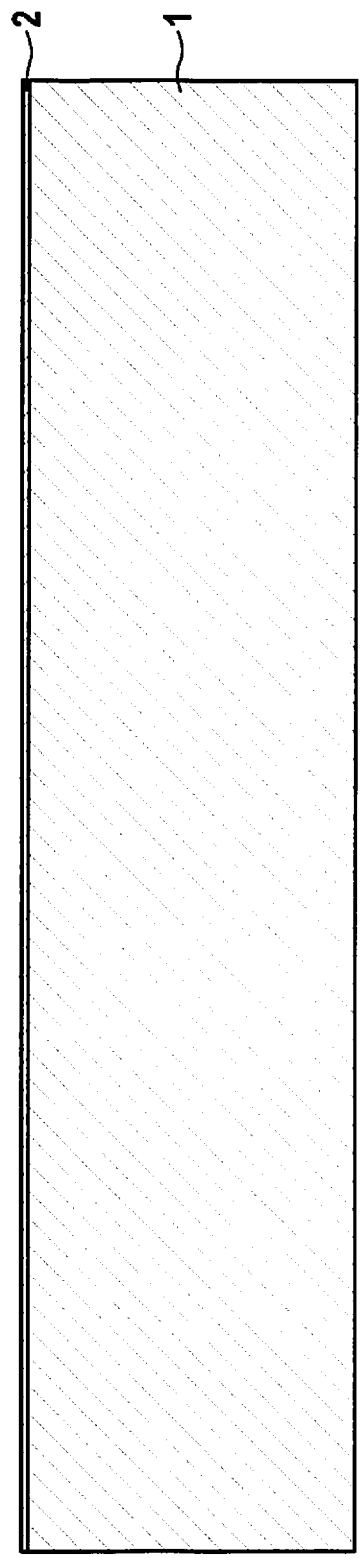

FIG. 1 shows a schematic sectional view of a MEMS substrate 1 with an oxide layer 2, situated thereon, which is situated on MEMS substrate 1 via a deposition process or via thermal oxidation, for example.

A fine grid is subsequently applied in oxide layer 2. The grid should have a sufficiently fine design so that, with holes of the grid having a size, at least in one direction, of approximately 0.5 µm, for example, so that in the subsequent oxide deposition process they may be easily reclosed with small layer thicknesses and very little topography.

Figure 2:
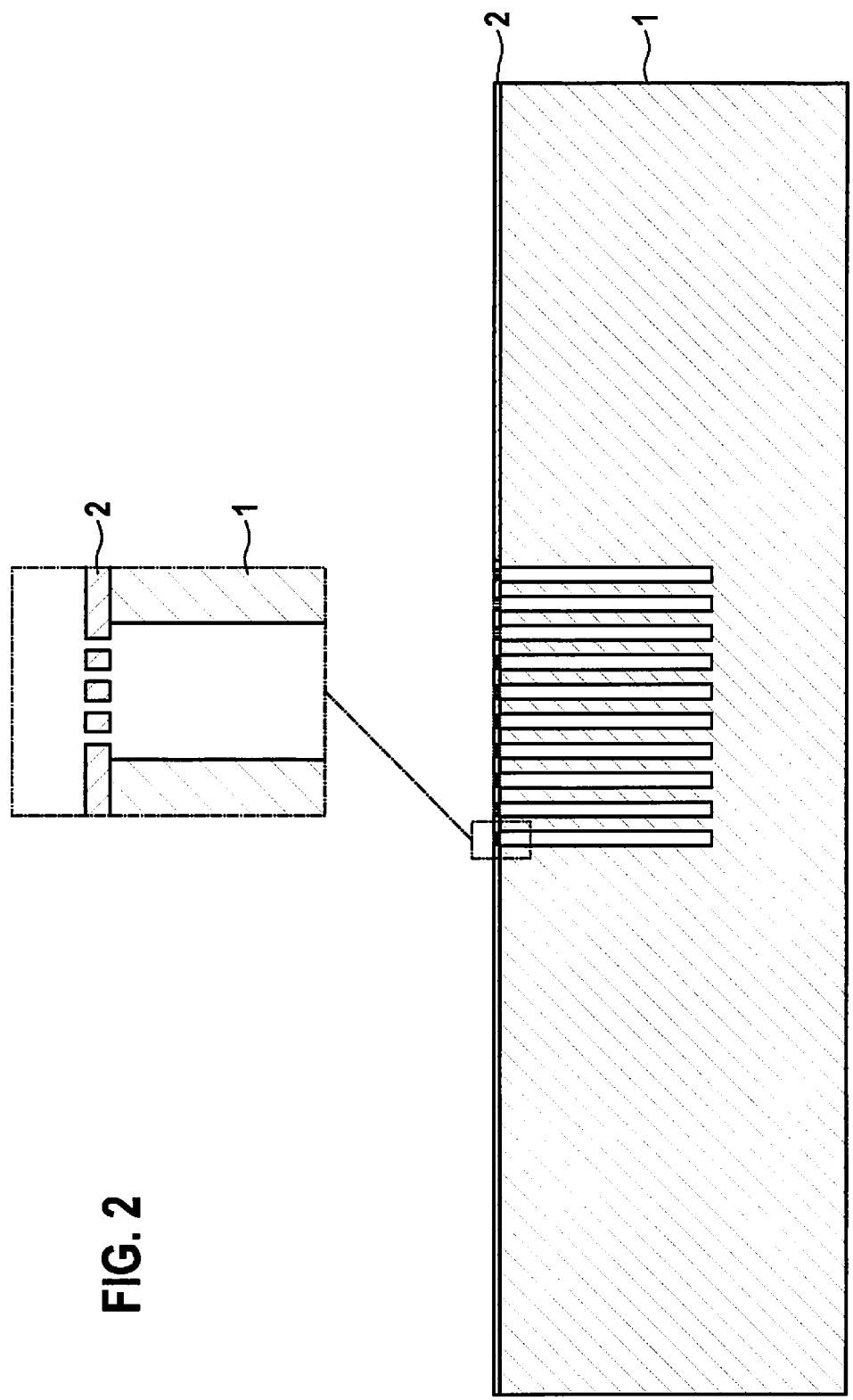

FIG. 2 shows a result of a subsequently carried out formation of etching trenches or deep trenches through the oxide grid, the oxide grid functioning as a mask for the trenching process (DRIE process, for example). Deep etching trenches, preferably having depths of approximately 50 µm to approximately 400 µm, are preferably formed in MEMS substrate 1. The top partial illustration in FIG. 2 shows an enlarged detail in which a portion of a deep etching trench with a portion of the oxide grid situated thereon is apparent.

The oxide grid is then closed by deposition of oxide material. The thickness of the oxide deposition is typically twice as great as the hole width in the oxide grid. A largely topography-free closing of the oxide grid advantageously takes place in this way. As a result, a "flat" or "smooth" surface is advantageously present, from which further processing may take place in a well-defined manner.

Deposition and doping of a thin first silicon layer 3 subsequently take place, preferably with the aid of low-pressure chemical vapor deposition (CVD) as polycrystalline silicon.

In FIG. 3 it is apparent that a fine grid is subsequently formed in first silicon layer 3.

The oxide material is subsequently removed beneath the grid of first silicon layer 3, as is apparent in FIG. 4. It is also apparent in FIG. 4 that closing the grid of first silicon layer 3 is then carried out by growing an additional silicon layer, for example via an LPCVD process or via epitaxial growth.

In this way a diaphragm area 3a of first silicon layer 3 is exposed on the bottom side. This is very useful at this early point in time, since otherwise, the exposure of the diaphragm area from the rear side via gas phase etching, after the grinding of the media access point, would have to take place at the very end of the process flow. However, as described above, this is possible, if at all, only with a high level of effort.

Structuring of first silicon layer 3 from the side of diaphragm area 3a subsequently takes place, as is apparent in FIG. 5. It is also apparent in FIG. 5 that growth, structuring, and exposure of a second silicon layer 4 are subsequently carried out, as well as deposition of another layer for implementing a bond interface 5 for a subsequent wafer bonding with a second wafer (not illustrated).

An illustration of further details of the process control is dispensed with here, since it involves conventional, standard processes of surface micromechanics. The overall system in FIG. 5 is illustrated in a rotation by 180 degrees to explain the subsequent preparation of MEMS wafer 10 for the wafer bonding.

A cap wafer 20 and MEMS wafer 10 are subsequently adjusted relative to one another for purposes of a precisely fitting wafer bonding. It is apparent in FIG. 6 that cap wafer 20, preferably an ASIC wafer including an ASIC substrate 21, previously applied electrical vias or TSVs 24, transistor circuits 23, and switching structures 22, is bonded to MEMS wafer 10. The wafer bonding process is preferably a metallic bonding process, since the intent of such a bonding process is to ensure seal-tightness not only of the sensor cavity around the diaphragm area, but also the electrical chip-to-chip contacts between MEMS wafer 10 and ASIC wafer 20. Examples of suitable metallic bonding processes are Al—Ge, Au—Si, Cu—Sn, Al—Al, Cu—Cu, and Au—Au.

Figure 7:
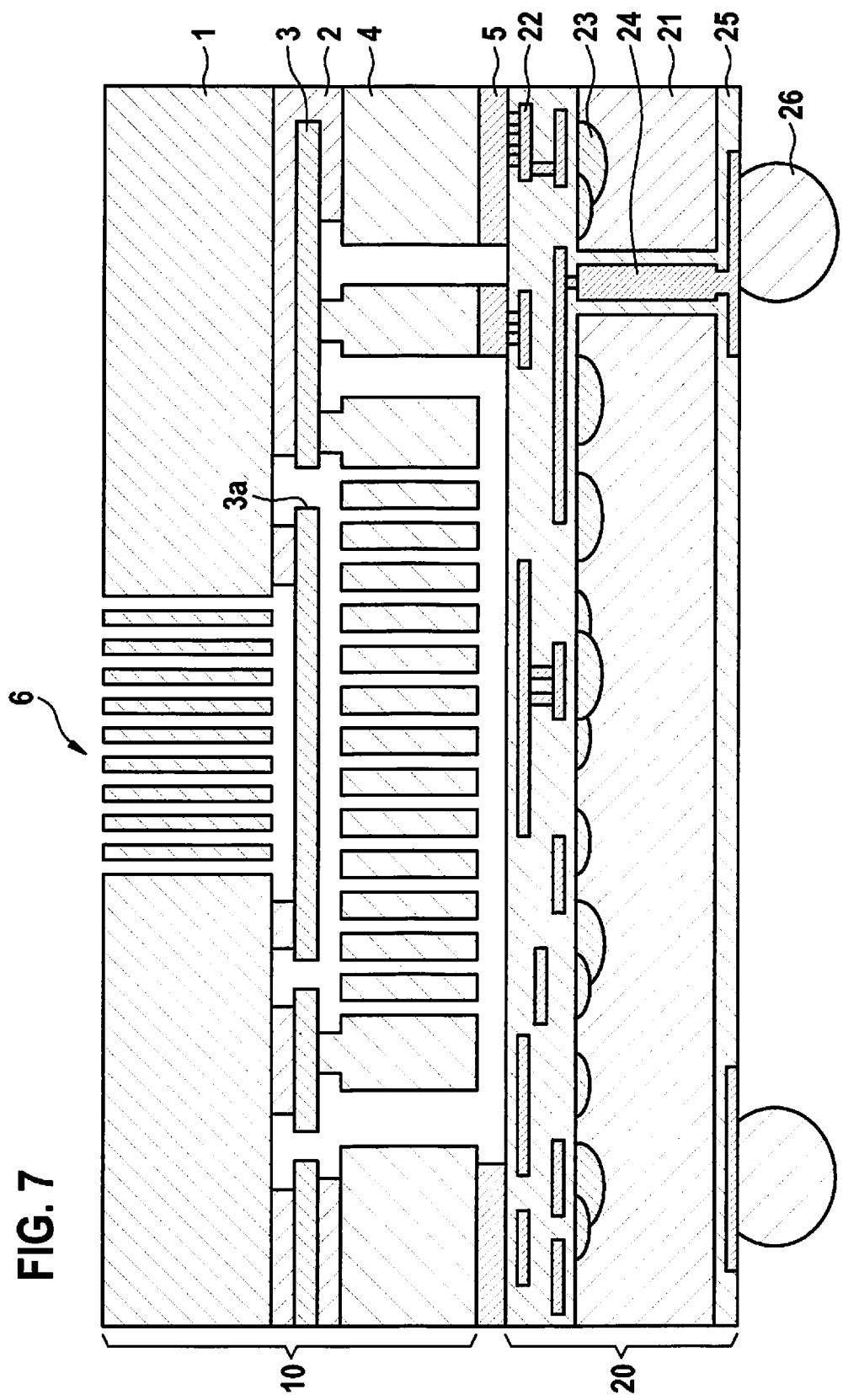

It is shown in FIG. 7 that after electrical vias 24 are exposed by back-grinding ASIC wafer 20 and applying and structuring passivations 25, contacting of electrical vias 24 with the aid of at least one wiring layer (redistribution layer (RDL)) is carried out. This optionally takes place using under bump metallization (UBM) and solder balls 26 for external electrical contacting of the component on an application circuit board (not illustrated).

Only at the end of the process flow is a media access point 6 to diaphragm area 3a of first silicon layer 3 created by a grinding process on the rear side of MEMS wafer 10, as is apparent in FIG. 7.

This is followed by several standard process steps, such as laser marking and separation of the components by a sawing process.

Thus, in the described process flow in FIGS. 1 through 7, all MEMS structures have been defined by surface micromechanical processes.

However, alternative methods for producing the MEMS functional layers (diaphragm layer and second silicon layer 4) are likewise possible without altering the basic concept of the present invention, i.e., pre-application of a trenched media access point with subsequent grinding of media access point 6.

A first alternative process flow that provides an additional wafer bonding is described in greater detail below.

Figure 8:
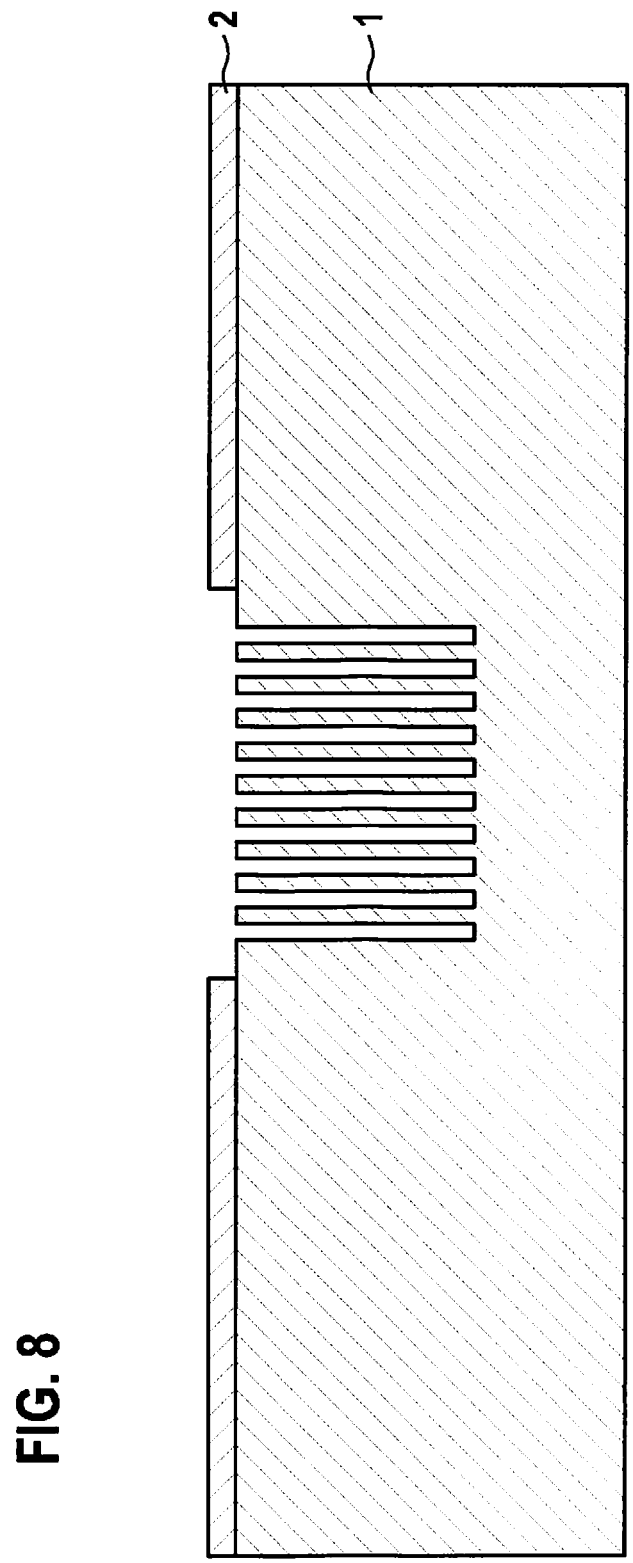
FIGS. 8 through 10 show an alternative process flow for producing the media access point of a micromechanical pressure sensor.

The process begins as described above with reference to FIGS. 1 and 2. The oxide material of oxide layer 2 in the future diaphragm area is subsequently removed, as indicated in FIG. 8.

Figure 9:
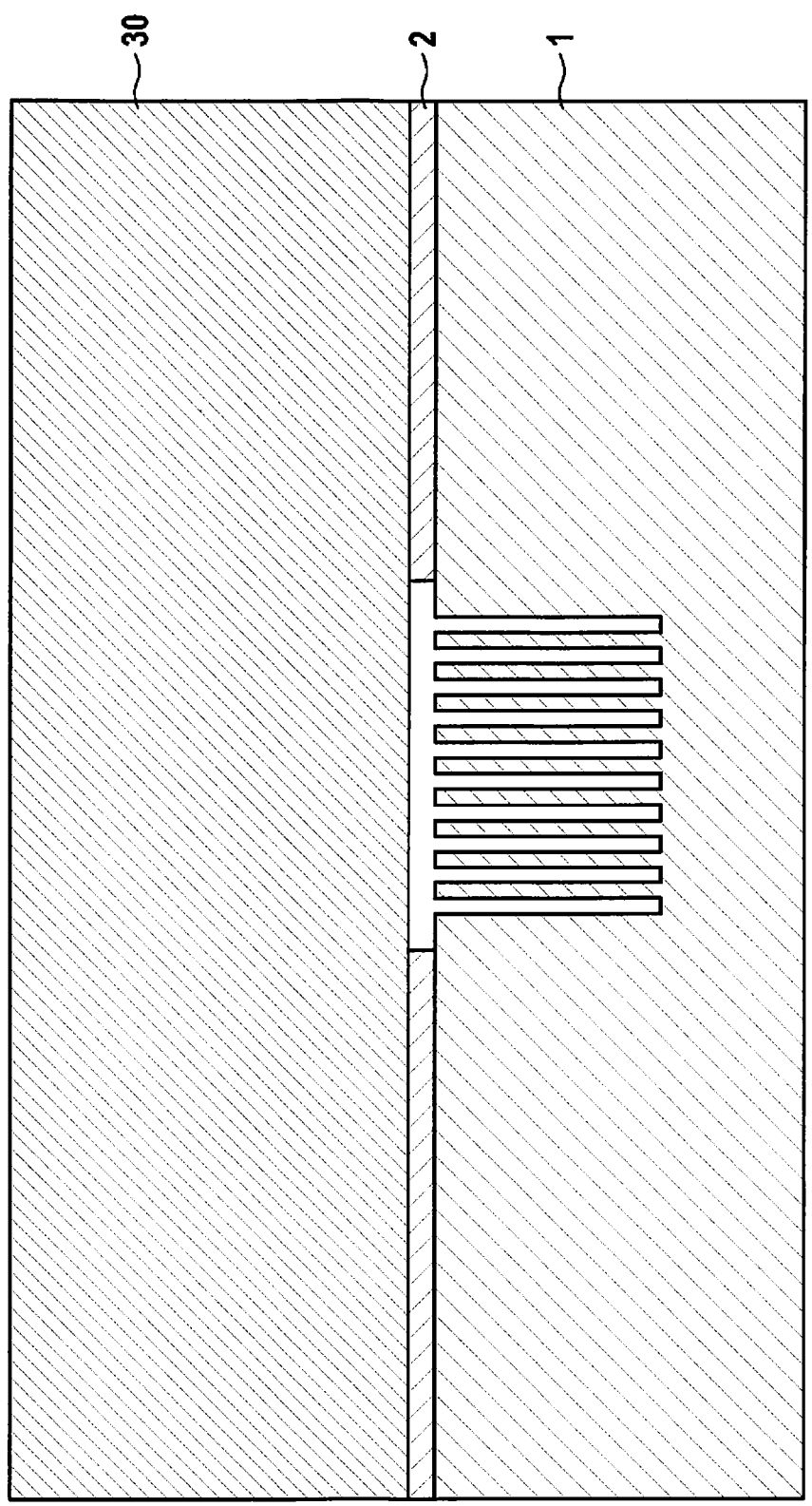

As is shown in FIG. 9, a silicon functional wafer 30 is then bonded to MEMS substrate 1 via a fusion bonding process or a direct bonding process.

Figure 10:
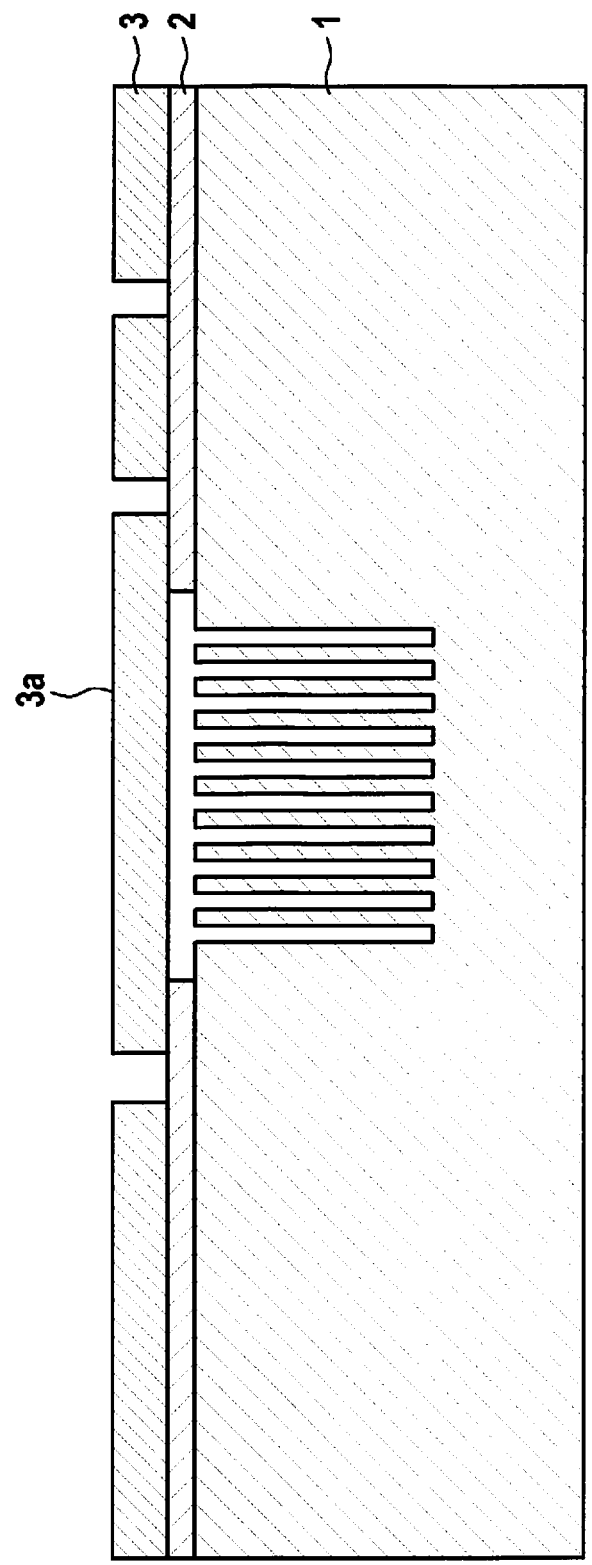

Silicon functional wafer 30 is subsequently thinned to the target thickness of the diaphragm layer, for example with the aid of back-grinding and chemical-mechanical polishing (CMP), as schematically shown in FIG. 10. As is further apparent in FIG. 10, diaphragm area 3a of first silicon layer 3, which originates from silicon functional wafer 30, and optionally also oxide layer 2, are structured at a lateral distance from the diaphragm area.

Figure 5:
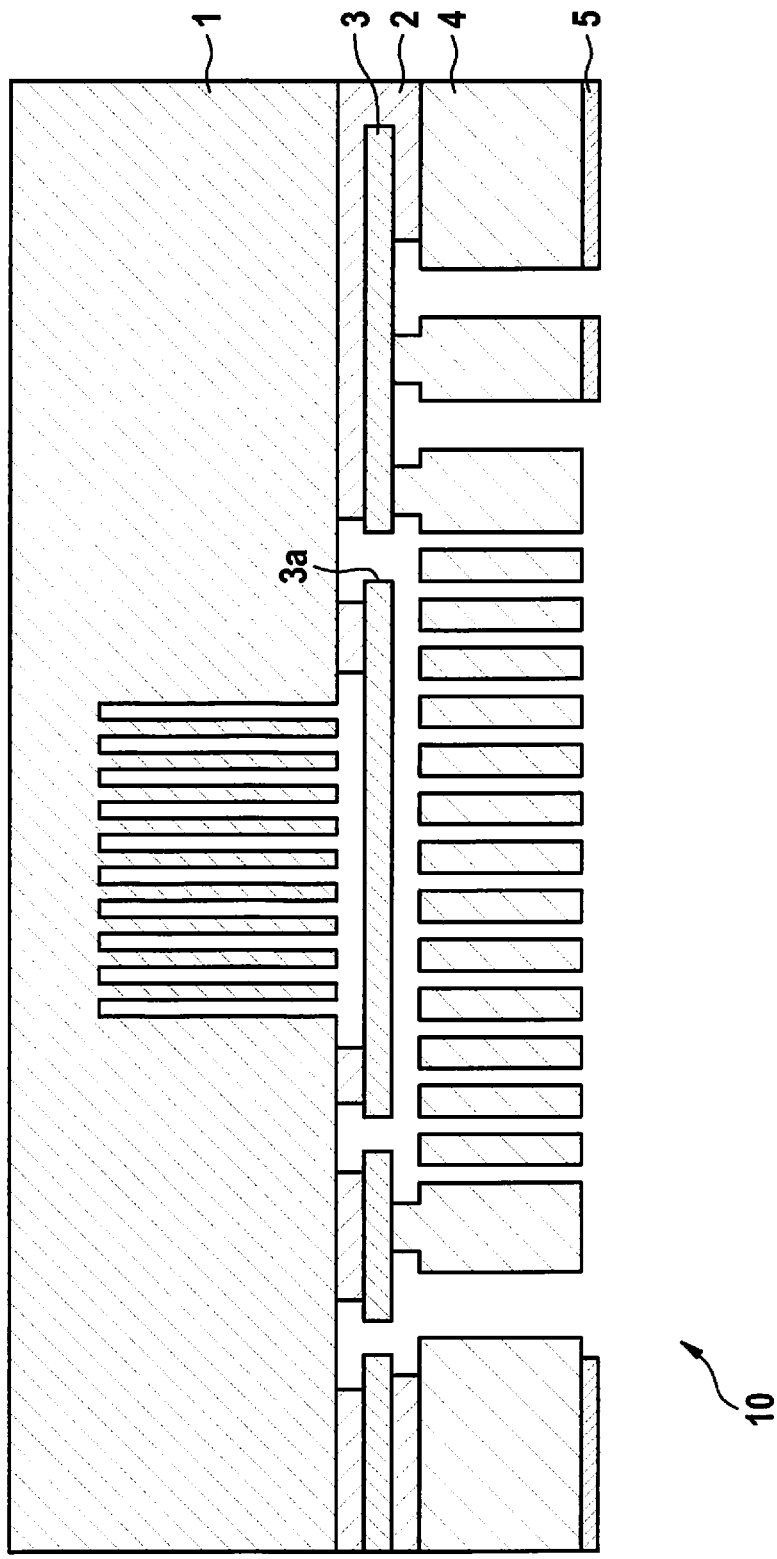
Figure 6:
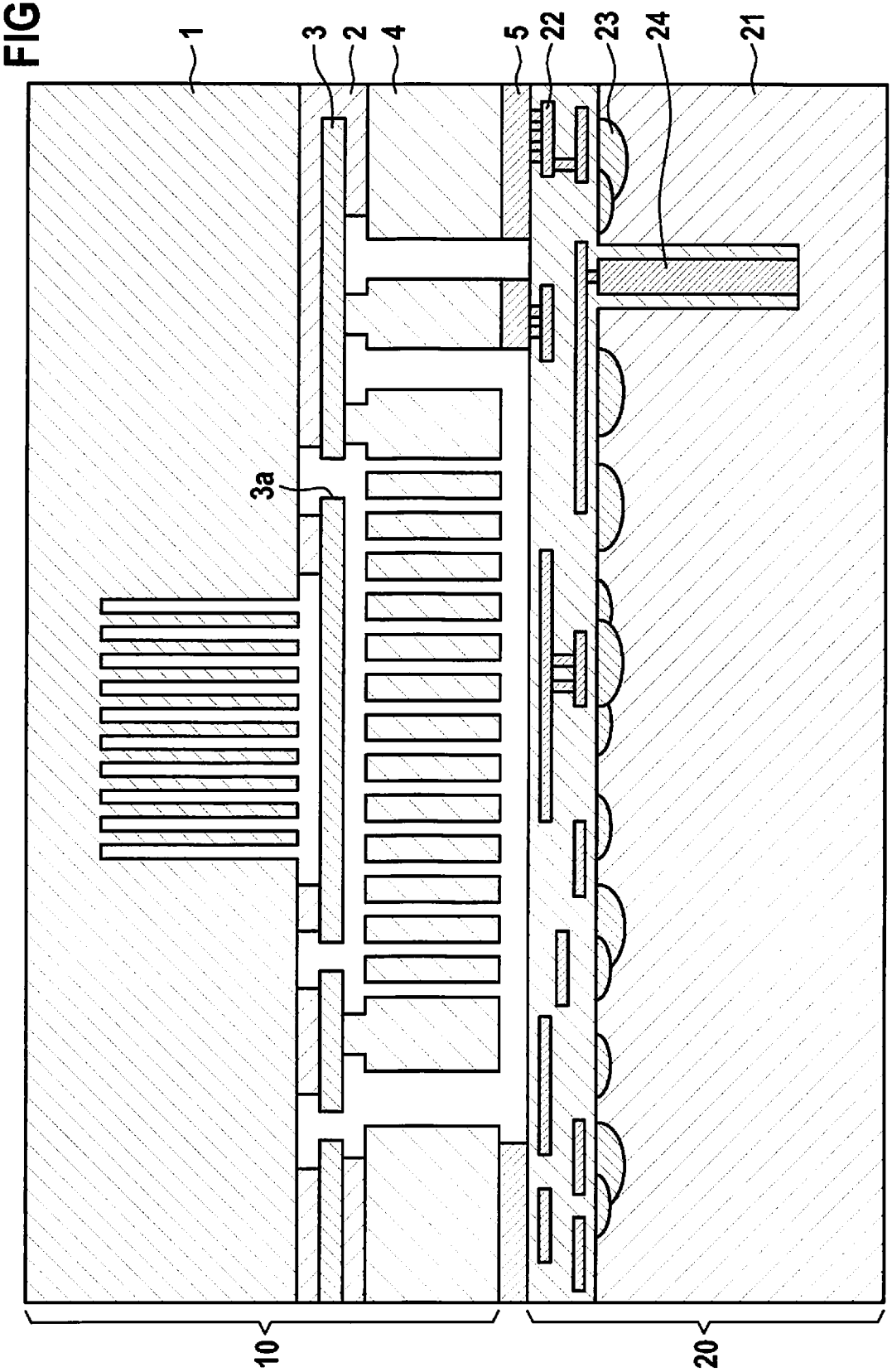

The subsequent process of completing the component may now be carried out analogously to the process steps explained for FIGS. 5 through 7.

Advantages of this first alternative process flow over the above-described process flow are, for example:

Diaphragm area 3a in this case is monocrystalline, and therefore has particularly well-defined physical properties. In addition, the exposure of the diaphragm area on the bottom side, i.e., the side facing the deep etching trenches or deep trenches of MEMS substrate 1, is simplified.

However, a substrate contact may not be applied in MEMS substrate 1 without further measures, which in effect means that MEMS substrate 1 will electrically float.

Pressure sensor diaphragms are generally quite thin, for example <10 μm, often even much thinner, in order for them to have high mechanical sensitivity. During back-grinding of thick silicon substrate wafer 30, fairly high process tolerances in the thickness of the diaphragm layer naturally result.

Another alternative process flow, in which surface micromechanical processes are of even less importance than in the second alternative process flow, is described below. Once again, the starting point here is the structure as described above for FIGS. 1 and 2.

Figure 11:
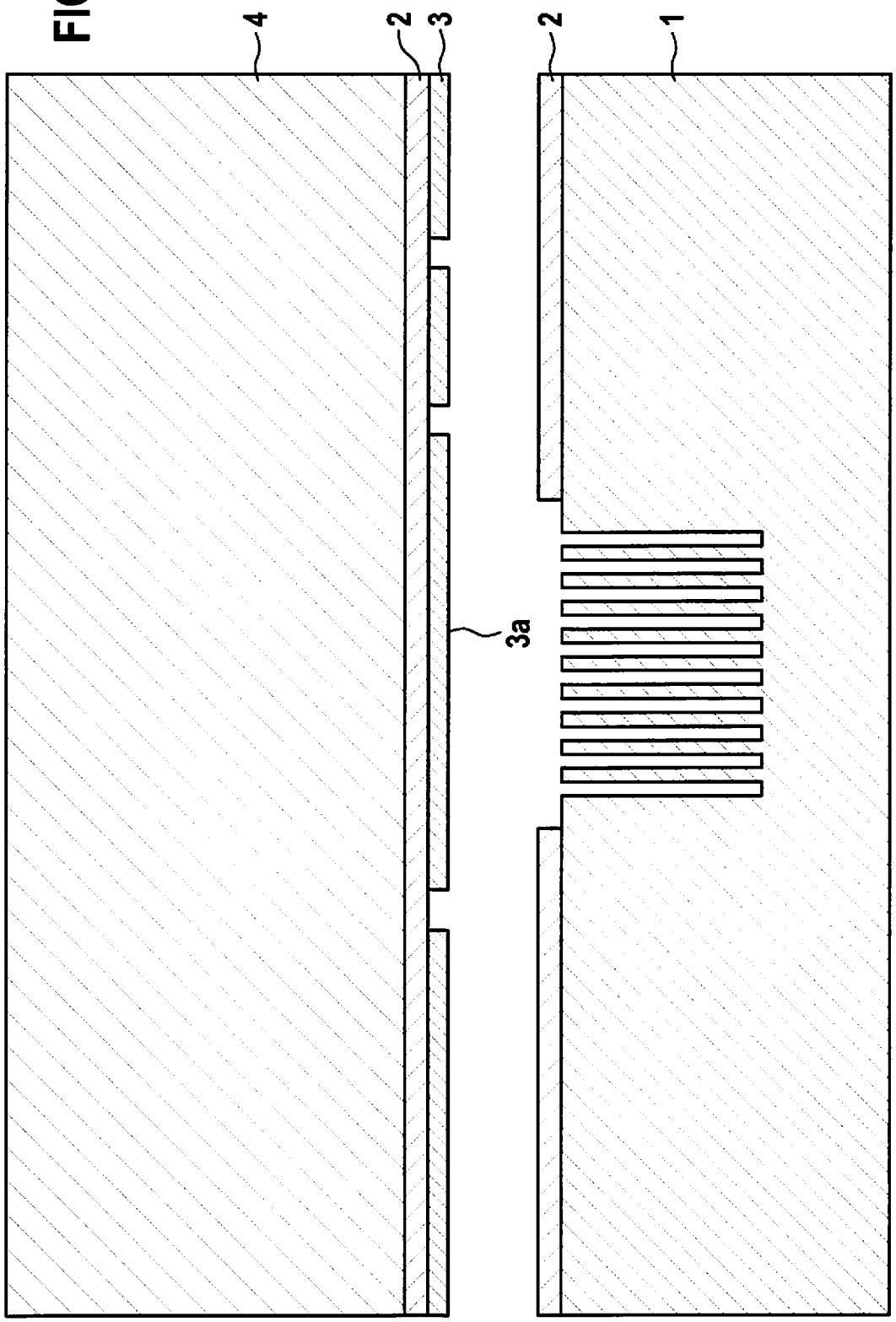
FIGS. 11 through 14 show an alternative process flow for producing the media access point of a micromechanical pressure sensor.

It is indicated in FIG. 11 that a prestructured multilayer wafer, preferably an SOI wafer including a second silicon layer 4, an oxide layer 2, and a first silicon layer 3, is provided, the subsequent diaphragm area for a pressure sensor being formed in thin first silicon layer 3.

The prestructured SOI wafer is subsequently joined to structured MEMS substrate 1 and oxide layer 2 situated thereon via a fusion process or direct bonding process.

Figure 12:
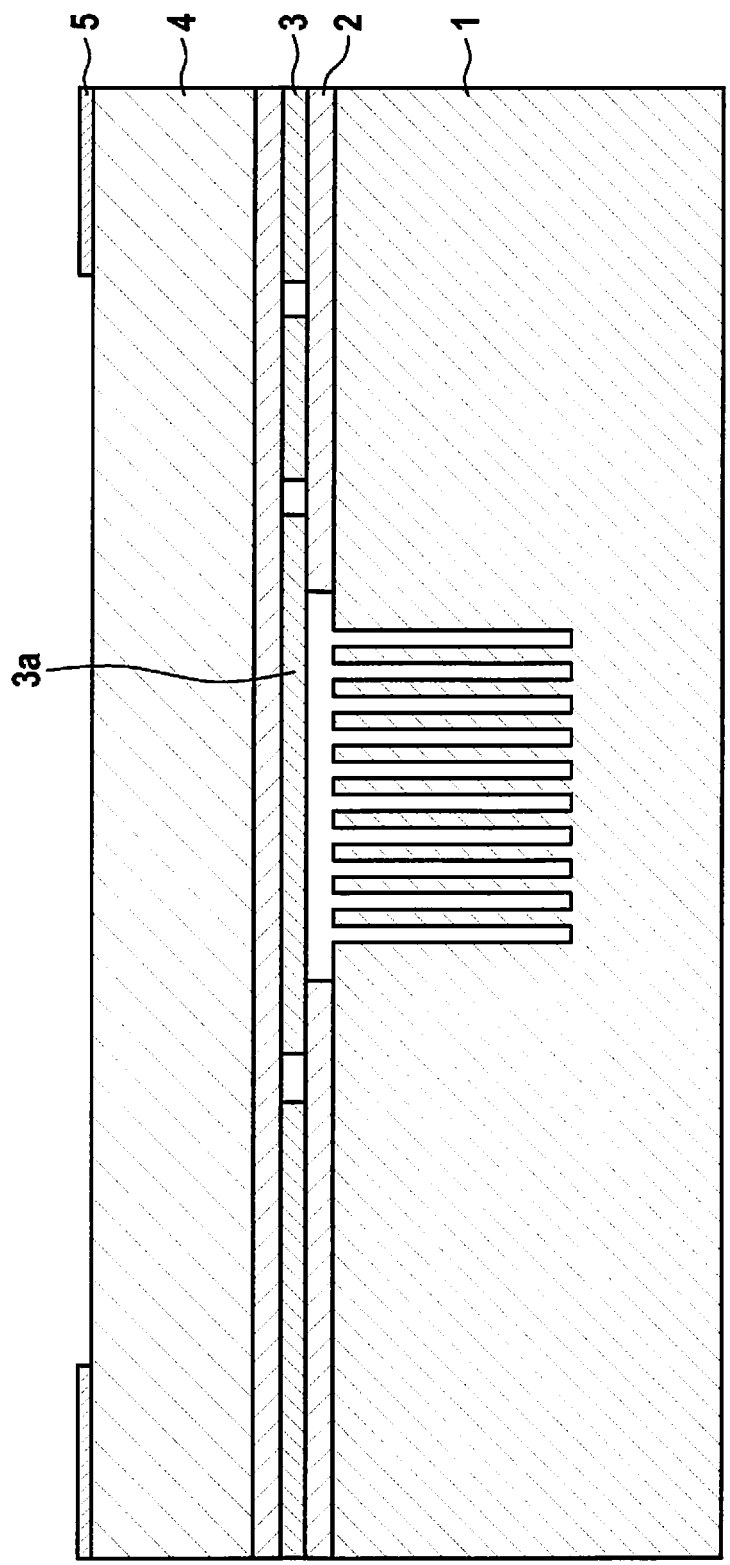

The SOI wafer is then ground back from the rear side to the target thickness of second silicon layer 4, as is apparent in FIG. 12. It is also apparent in FIG. 12 that bond interface 5 to cap wafer or ASIC wafer 20 is subsequently formed on second silicon layer 4.

A first trenching of second silicon layer 4 for defining electrical contacts with respect to the diaphragm level then takes place.

The oxide material in the trenches is subsequently opened, followed by metal deposition (tungsten, for example) in the resulting trenches, and structuring of metal 7 for establishing an electrical connection between the diaphragm layer and second silicon layer 4.

Figure 13:
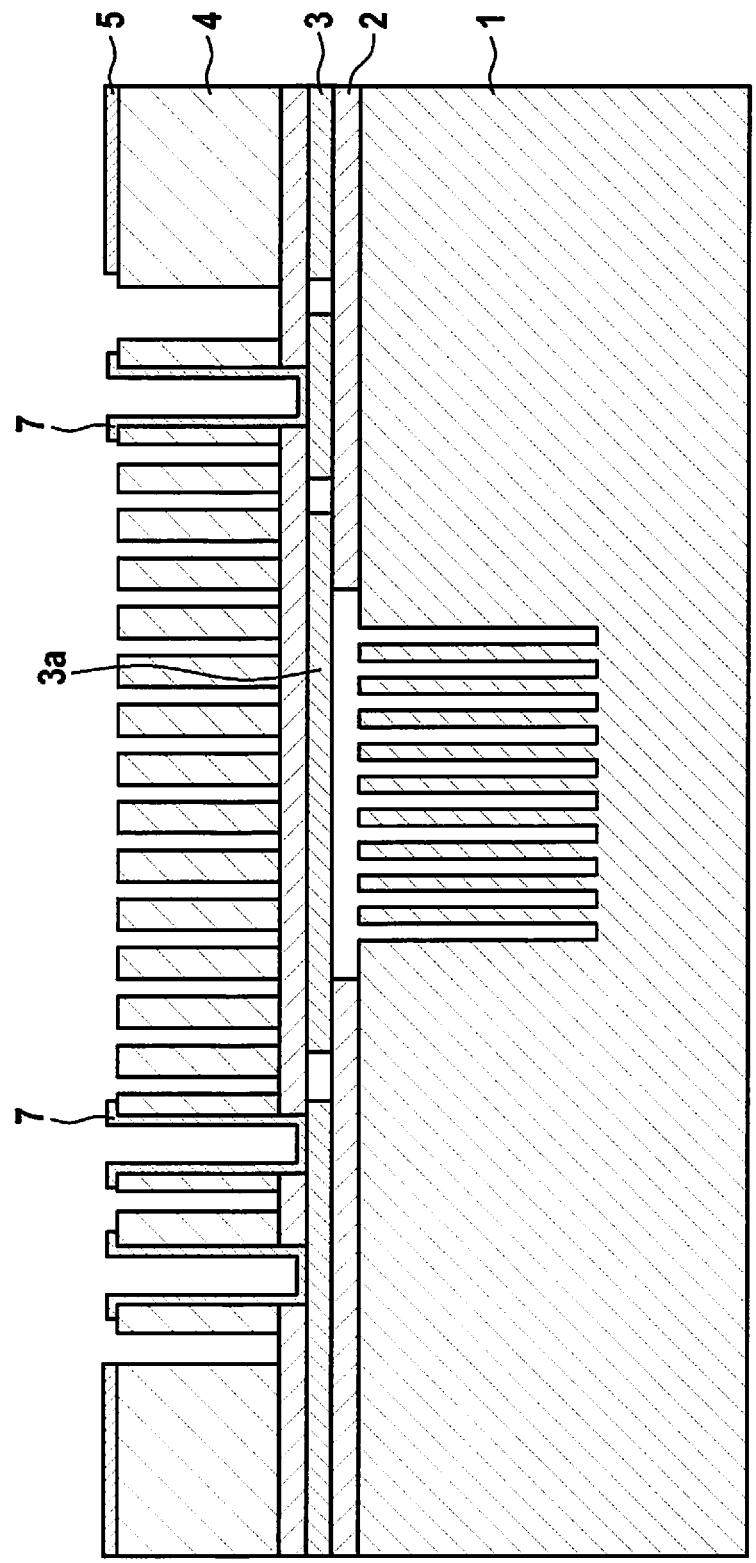

FIG. 13 shows that a second trenching of second silicon layer 4 has been carried out to define further MEMS structural elements. In particular, access channels are also hereby produced in second silicon layer 4 for a subsequent gas phase etching step.

Figure 14:
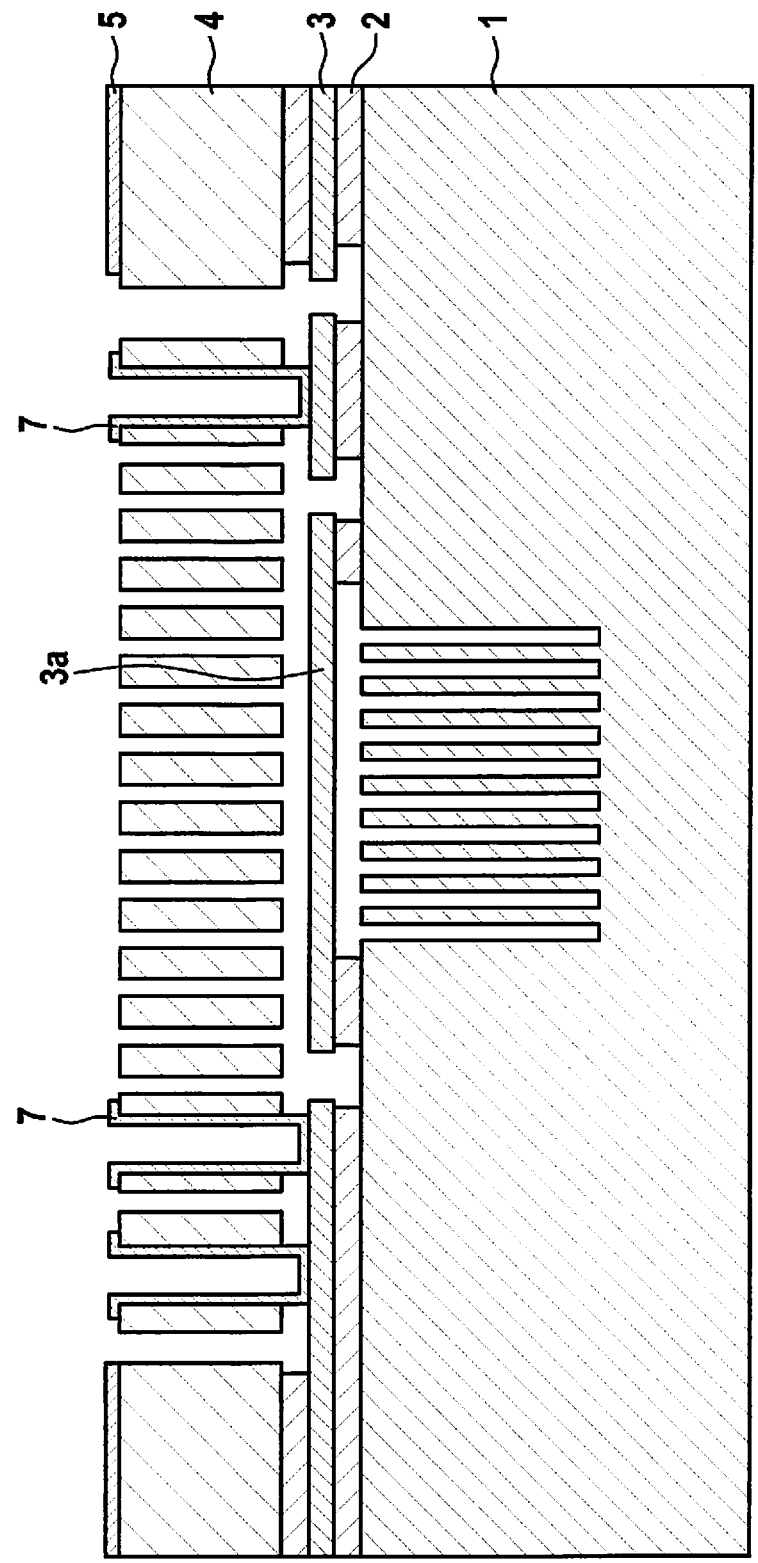

It is shown in FIG. 14 that diaphragm area 3a of first silicon layer 3 has been exposed on the top side via a gas phase etching process carried out using gaseous HF. The state of the structure now greatly resembles that of FIG. 5, so that the further process flow may take place analogously to the process steps in FIGS. 5 through 7.

A useful enhancement of the provided process flows lies in applying additional trenches that fulfill other functions in addition to the media access point for the pressure sensor.

Figure 15:
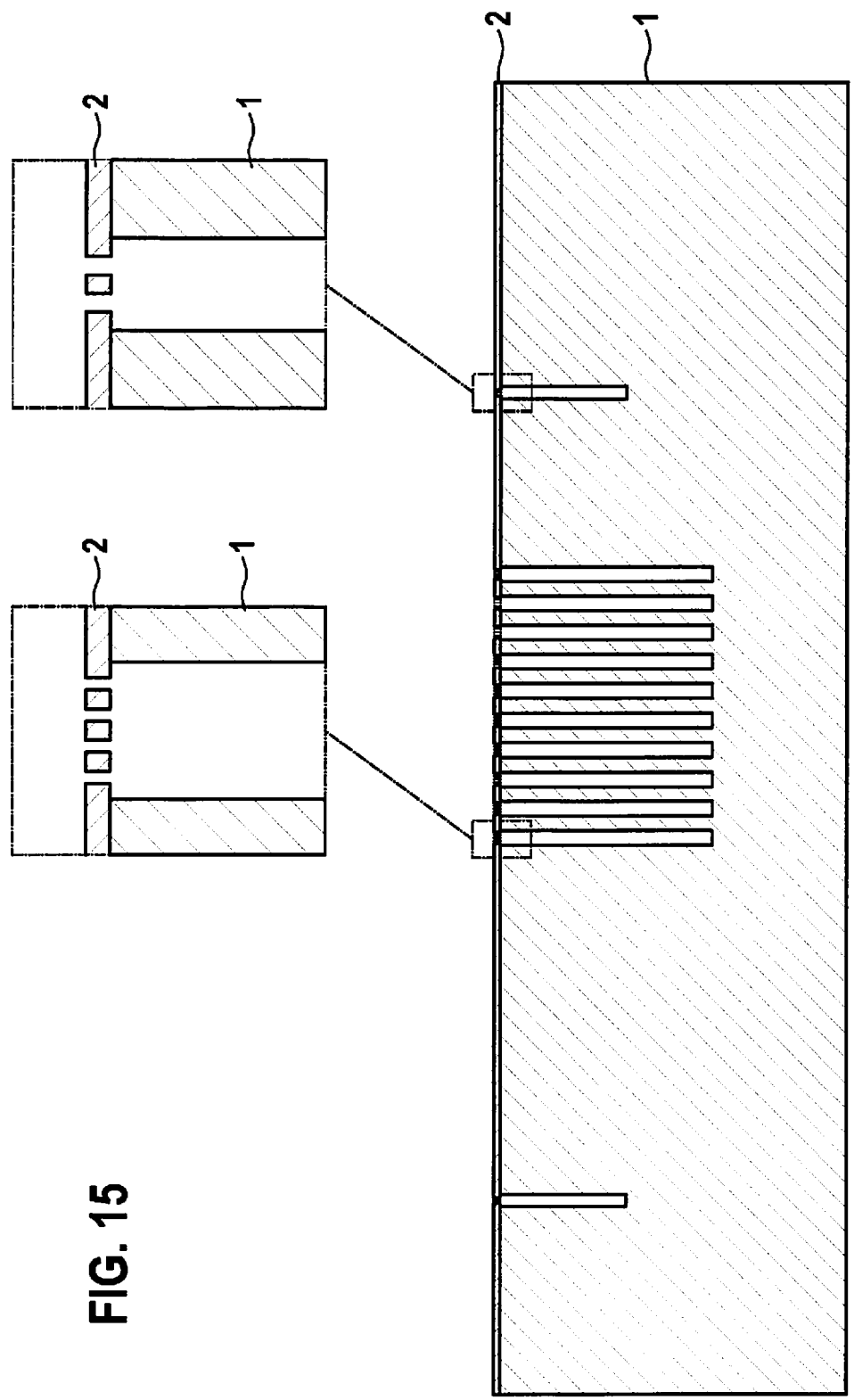
FIGS. 15 through 17 show measures for providing stress decoupling for the micromechanical pressure sensor.

FIG. 15 shows a system in which further trenches or etching trenches are formed in MEMS substrate 1, laterally spaced apart from the diaphragm area. In this exemplary embodiment, these further etching trenches have a narrower design than those for media access point 6. Since the trenching process in wide trenches proceeds more quickly, due to the ARDE effect, than in narrow trenches, etching trenches of different depths may be implemented by a suitable selection of the trench widths, with the same etching duration. In this case, the further etching trenches are provided as stress decoupling trenches.

Figure 16:
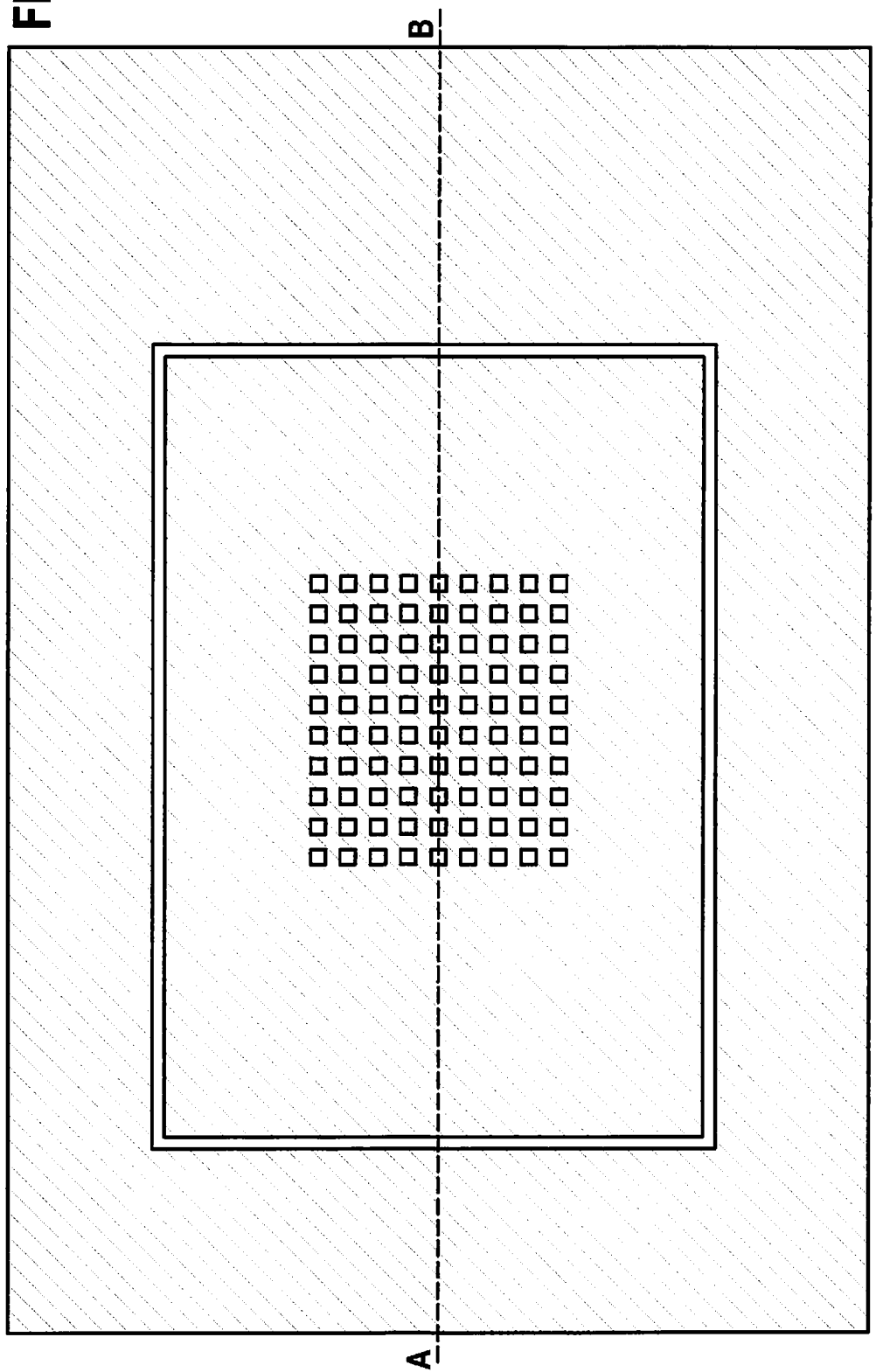
Figure 17:
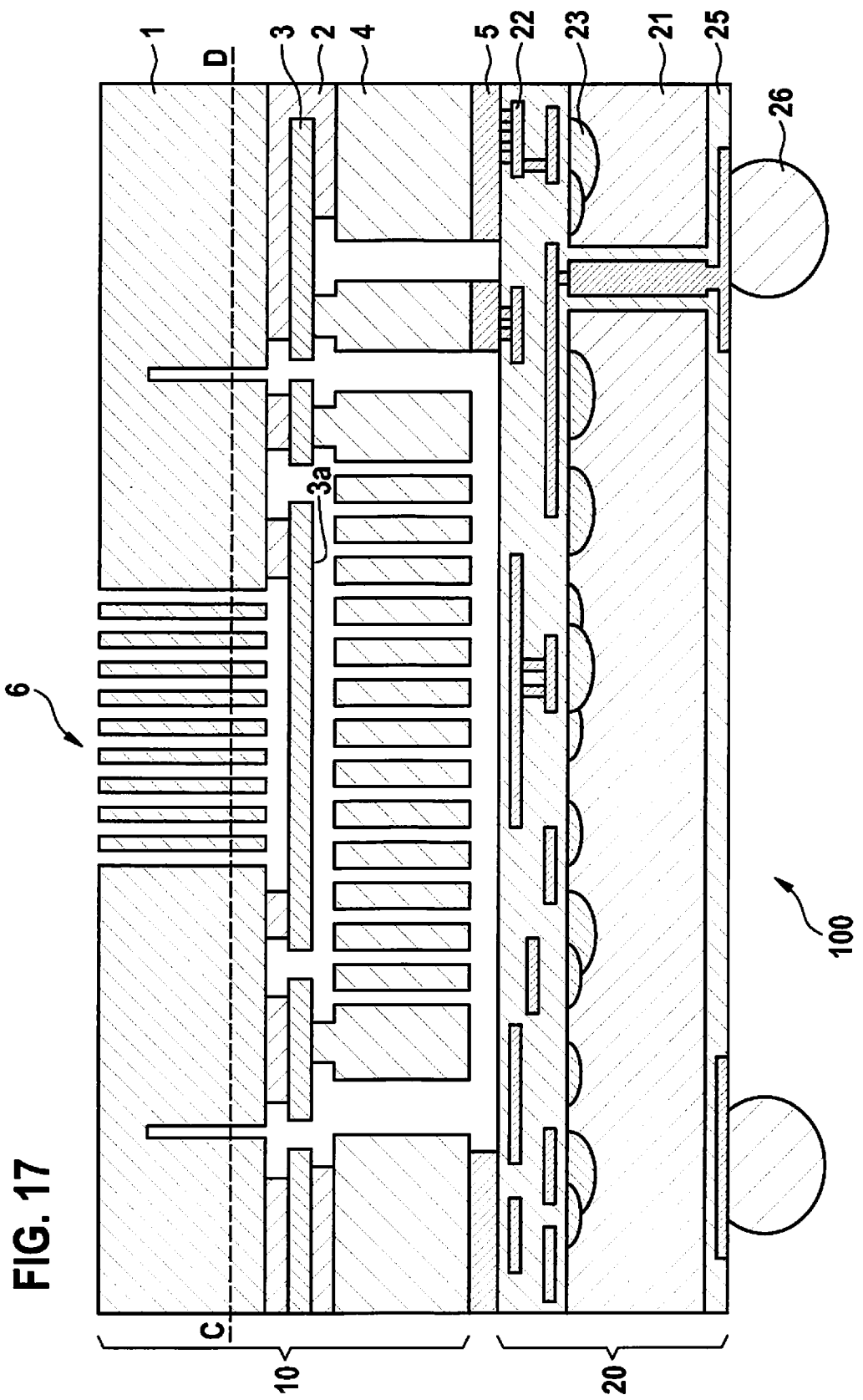

In this regard, FIG. 16 shows a top view along a section line C-D from FIG. 17, and FIG. 17 shows a cross-sectional view along a section line A-B from FIG. 16, through the completely processed component. As is apparent in FIG. 16, a narrow closed trench as a stress decoupling trench, which circumferentially surrounds the diaphragm area that includes the etching trenches, is formed in MEMS substrate 1.

Alternatively, the stress decoupling trench may also not be closed in at least one location, since electrical contacting (not illustrated) of the diaphragm area must take place from at least one side. The feeding of the electrical line in this case takes place via a spring bar that has quite high flexibility to ensure the best possible stress decoupling. Other forms of bars, for example as multiple meanders, are also possible here, or it is possible to provide a spring bar in each case at various sides of the diaphragm (top and bottom, for example). The basic concept of the stress decoupling trenches is described in German Patent Application No. DE 10 2014 210 945 A1.

During the final back-grinding of MEMS substrate 1 of MEMS wafer 10, the channels for media access point 6 are ground, while the less deep trenches for the stress decoupling are not ground. The result is apparent in FIG. 17.

Instead of the ARDE effects and the associated limitation with regard to the allowable trench widths, for producing media access channels and stress decoupling trenches a multistage trenching process may also be carried out, in which initially only the deep trenches for the media access point up to a certain depth are produced. At the same time, in a further trenching step the stress decoupling trenches are applied and the deep trenches for the media access point are etched to the target value.

The presented process flows are all suited for the simultaneous manufacture of pressure sensors and inertial sensors. Thus, for example, 4D elements (3D acceleration and pressure), TPMS sensors (1-2D acceleration and pressure), 7D elements (3D acceleration and 3D rotation rate and pressure) may be manufactured. The pressure sensors may advantageously be provided as sound pressure sensors for microphones.

The provided method may also be used for providing a suitable cavity internal pressure. For this purpose, it is additionally provided that a trenched media access point for a pressure sensor is applied and, at a lateral distance therefrom, in addition at least one trenched vent channel for a further sensor, for example an acceleration sensor or rotation rate sensor, is applied.

A pressure sensor element is subsequently situated in the area of the trenched media access point, and of a further sensor element, for example an acceleration sensor or rotation rate sensor, is situated in the area of the trenched vent channel. The pressure sensor and the further sensor are situated in separate cavities. The cavities are hermetically separated from one another by a bonding web that extends in the interior of the chip.

This is followed by grinding of the media access point for the pressure sensor, and at the same time, of the vent channel for the further sensor.

This is followed by evacuation or setting of a desired internal pressure for the further sensor, and in addition, possible inclusion of anti-stick coating (ASC) material for an acceleration sensor and closure of the vent channel for the further sensor at a defined gas pressure, for example a high internal pressure being provided for an acceleration sensor and a low internal pressure being provided for a rotation rate sensor. The closure particularly preferably takes place with the aid of a laser reseal process, as is described in German Patent Application No. DE 10 2014 202 801 A1, for example.

The above-mentioned optional additional steps are not illustrated in the figures.

It is also advantageously possible to equip the further sensors, such as acceleration sensors and rotation rate sensors, with circumferential stress decoupling trenches according to FIGS. 16 and 17, or to combine stress decoupling trenches and vent channels for the further sensors.

Figure 18:
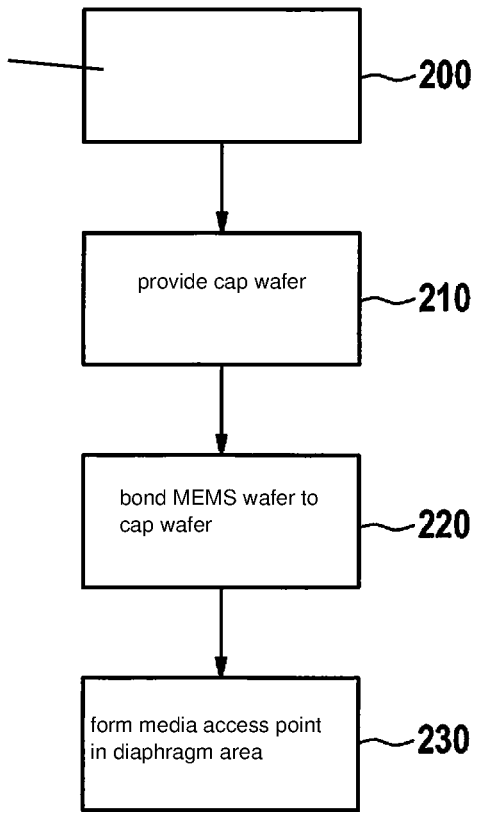
FIG. 18 shows a schematic sequence of a method for manufacturing a micromechanical pressure sensor according to the present invention.

FIG. 18 shows a schematic sequence of the provided method:

A MEMS wafer 10 including a MEMS substrate 1 is provided in a step 200, a defined number of etching trenches being formed in MEMS substrate 1 in a diaphragm area, the diaphragm area being formed in a first silicon layer 3 that is situated at a defined distance from MEMS substrate 1.

A cap wafer 20 is provided in a step 210.

Bonding of MEMS wafer 10 to cap wafer 20 is carried out in a step 220.

Lastly, a media access point 6 to the diaphragm area is formed in a step 230 by grinding MEMS substrate 1. This may take place, for example, by exposing etching channels 6.

Although the present invention has been described above with reference to specific application examples, those skilled in the art may also implement specific embodiments of the present invention that are not described or only partly described above, without departing from the core of the present invention.

What is claimed is:

1. A method for manufacturing a micromechanical sensor, comprising:
providing a MEMS wafer that includes a MEMS substrate, a plurality of etching trenches being formed in the MEMS substrate in a diaphragm area opposite a diaphragm, the diaphragm being formed in a first silicon layer situated at a defined distance from the MEMS substrate;
providing a cap wafer;
bonding the MEMS wafer to the cap wafer; and
forming a media access point to the diaphragm area by grinding the MEMS substrate;
wherein:
(I) (1) the etching trenches are formed above the diaphragm and the cap wafer is arranged below the diaphragm, so that the diaphragm is arranged between the etching trenches and the cap wafer, and/or (2) the formation of the media access point is performed after the bonding of the MEMS wafer to the cap wafer; and
(II) (1) during formation of the etching trenches in the MEMS substrate, an additional etching trench is formed that is laterally spaced apart in a defined manner from the plurality of etching trenches, and that has a narrower design, in a defined manner, than each of the etching trenches for the media access point, and (2) one or both of the following:
a) the additional etching trench encircles the plurality of etching trenches; and
b) the additional etching trench is left unfilled, extends from a first of its ends to a second of its ends in a direction in which the plurality of etching trenches extend from the media access point towards the diaphragm, and is closed at the first of its ends and open at the second of its ends while the plurality of etching trenches open to the diaphragm and have the media access point.

2. The method as recited in claim 1, wherein the following steps are carried out in forming the diaphragm area:
a) applying an oxide layer to the MEMS substrate;
b) forming through openings in the oxide layer;
c) forming etching trenches in the diaphragm area of the MEMS substrate via the through openings of the oxide layer;
d) closing the through openings of the oxide layer with oxide material;
e) applying a first silicon layer to the oxide layer;
f) forming through openings in the diaphragm area of the first silicon layer;
g) removing the oxide layer beneath the through openings in the diaphragm area of the first silicon layer; and
h) closing the through openings of the diaphragm area of the first silicon layer, essentially free of topography.

3. The method as recited in claim 1, wherein the following steps are carried out in forming the diaphragm area:
a) applying an oxide layer to the MEMS substrate;
b) forming through openings in the oxide layer;
c) forming etching trenches in the diaphragm area of the MEMS substrate via the through openings of the oxide layer;
d) closing the through openings of the oxide layer with oxide material;
e) removing the oxide material of the oxide layer in the area of the diaphragm area;
f) bonding a silicon function wafer to the MEMS wafer; and
g) back-grinding the silicon function wafer to a defined target thickness of the diaphragm area.

4. The method as recited in claim 1, wherein the diaphragm area of the first silicon layer is a pressure sensor diaphragm.

5. The method as recited in claim 1, wherein the micromechanical sensor is a micromechanical pressure sensor.

6. The method as recited in claim 5, wherein the micromechanical pressure sensor is a sound pressure sensor for a microphone.

7. The method as recited in claim 1, wherein the etching trenches are formed above the diaphragm and the cap wafer is arranged below the diaphragm, so that the diaphragm is arranged between the etching trenches and the cap wafer.

8. The method as recited in claim 1, wherein the formation of the media access point is performed after the bonding of the MEMS wafer to the cap wafer.

9. The method as recited in claim 8, wherein the etching trenches are formed above the diaphragm and the cap wafer is arranged below the diaphragm, so that the diaphragm is arranged between the etching trenches and the cap wafer.

10. The method as recited in claim 9, wherein the formation of the media access point is performed at a side of the etching trenches facing away from the diaphragm.

11. A method for manufacturing a micromechanical sensor, comprising:
providing a MEMS wafer that includes a MEMS substrate, a plurality of etching trenches being formed in the MEMS substrate in a diaphragm area opposite a diaphragm, the diaphragm being formed in a first silicon layer situated at a defined distance from the MEMS substrate;
providing a cap wafer;
bonding the MEMS wafer to the cap wafer; and
forming a media access point to the diaphragm area by grinding the MEMS substrate;
wherein:
(I) (1) the etching trenches are formed above the diaphragm and the cap wafer is arranged below the diaphragm, so that the diaphragm is arranged between the etching trenches and the cap wafer, and/or (2) the formation of the media access point is performed after the bonding of the MEMS wafer to the cap wafer; and (II) the following steps are carried out in forming the diaphragm area:
   a) applying an oxide layer to the MEMS substrate;
   b) forming through openings in the oxide layer;
   c) forming the plurality of etching trenches in the diaphragm area of the MEMS substrate via the through openings of the oxide layer;
   d) closing the through openings of the oxide layer with oxide material;
   e) providing a prestructured multilayer wafer that includes a second silicon layer;
   f) joining the prestructured multilayer wafer to the MEMS wafer with the aid of a wafer bonding process;
   g) back-grinding the prestructured multilayer wafer to the target thickness of the second silicon layer;
   h) forming a bond interface on the second silicon layer;
   i) forming through openings in the second silicon layer for defining the electrical contacts with the diaphragm area;
   j) opening the oxide layer beneath the through openings of the second silicon layer formed in step i);
   k) depositing a metal in the through openings formed in steps i) and j), and structuring the metal to establish an electrical connection between the diaphragm area and the second silicon layer;
   l) carrying out a second trenching operation for forming MEMS structural elements in the second silicon layer; and
   m) removing oxide material beneath the MEMS structural elements formed in step 1).

12. A micromechanical sensor element, comprising:
a MEMS wafer that includes a MEMS substrate, a plurality of etching trenches being formed in the MEMS substrate opening, at a first end of the substrate, into a diaphragm area that is above a diaphragm, the diaphragm being formed in a first silicon layer situated below the MEMS substrate at a defined distance from the MEMS substrate;
an additional etching trench that is laterally spaced apart from the plurality of etching trenches and is narrower than each of the plurality of etching trenches; and
a cap wafer;
wherein:
   the MEMS wafer is bonded to the cap wafer below the diaphragm, so that the diaphragm is arranged between the etching trenches and the cap wafer;
   there is a media access point to the diaphragm area formed by grinding the MEMS substrate from above the etching trenches so that the media access point is an opening at a second end of the MEMS substrate opposite the first end of the MEMS substrate; and
   the additional etching trench (I) encircles the plurality of etching trenches, and/or (II) is left unfilled, extends from a first of its ends to a second of its ends in a direction in which the plurality of etching trenches extend from the media access point towards the diaphragm, and is closed at the first of its ends and open at the second of its ends while the plurality of etching trenches are open to the diaphragm and have the media access point.

13. The micromechanical sensor element as recited in claim 12, wherein the additional etching trench encircles the plurality of etching trenches.

14. The micromechanical sensor element as recited in claim 12, wherein the additional etching trench is left unfilled, extends from the first of its ends to the second of its ends in the direction in which the plurality of etching trenches extend from the media access point towards the diaphragm, and is closed at the first of its ends and open at the second of its ends while the plurality of etching trenches are open to the diaphragm and have the media access point.

15. The micromechanical sensor element as recited in claim 12, wherein a plurality of through holes are arranged in a layer between the diaphragm and the cap wafer, the plurality of through holes being passages via which the diaphragm is exposed to a surface of the cap wafer facing the diaphragm.

16. A micromechanical sensor element, comprising:
a MEMS wafer that includes a MEMS substrate, a plurality of etching trenches being formed in the MEMS substrate opening, at a first end of the MEMS substrate, into a diaphragm area opposite a diaphragm, the diaphragm being formed in a first silicon layer situated at a defined distance from the MEMS substrate;
an additional etching trench that is laterally spaced apart from the plurality of etching trenches and is narrower than each of the plurality of etching trenches; and
a cap wafer;
wherein:
   the MEMS wafer is bonded to the cap wafer;
   the etching trenches are open at respective first ends of the etching trenches, which are at the first end of the MEMS substrate;
   an opening at a second end of the MEMS substrate, that is opposite the first end, forms a media access point to the diaphragm; and
   the additional etching trench (I) encircles the plurality of etching trenches, and/or (II) is left unfilled, extends from a first of its ends to a second of its ends in a direction in which the plurality of etching trenches extend from the media access point towards the diaphragm, and is closed at the first of its ends and open at the second of its ends while the plurality of etching trenches are open to the diaphragm and have the media access point.

17. The micromechanical sensor element as recited in claim 16, wherein the first ends of the etching trenches face towards the diaphragm.

18. The micromechanical sensor element as recited in claim 16, wherein the additional etching trench encircles the plurality of etching trenches.

19. The micromechanical sensor element as recited in claim 16, wherein the additional etching trench is left unfilled, extends from the first of its ends to the second of its ends in the direction in which the plurality of etching trenches extend from the media access point towards the diaphragm, and is closed at the first of its ends and open at the second of its ends while the plurality of etching trenches are open to the diaphragm and have the media access point.

20. The micromechanical sensor element as recited in claim 16, wherein a plurality of through holes are arranged in a layer between the diaphragm and the cap wafer, the plurality of through holes being passages via which the diaphragm is exposed to a surface of the cap wafer facing the diaphragm.

* * * * *